(12) United States Patent
Wang et al.

(10) Patent No.: US 12,610,786 B2
(45) Date of Patent: Apr. 21, 2026

(54) SEMICONDUCTOR LAYOUT STRUCTURE AND SEMICONDUCTOR TEST STRUCTURE

(71) Applicant: CHANGXIN MEMORY TECHNOLOGIES, INC., Hefei City (CN)

(72) Inventors: Xiangyu Wang, Hefei City (CN); Ning Li, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 932 days.

(21) Appl. No.: 17/817,222

(22) Filed: Aug. 3, 2022

(65) Prior Publication Data

US 2023/0326811 A1      Oct. 12, 2023

Related U.S. Application Data

(63) Continuation of application No. PCT/CN2022/093395, filed on May 17, 2022.

(30) Foreign Application Priority Data

Apr. 12, 2022    (CN) .......................... 202210382204.0

(51) Int. Cl.
*H10P 74/00*        (2026.01)
*H10D 84/87*        (2025.01)
*H10W 72/30*        (2026.01)

(52) U.S. Cl.
CPC ........... *H10P 74/273* (2026.01); *H10D 84/87* (2025.01); *H10W 72/327* (2026.01); *H10W 72/357* (2026.01)

(58) Field of Classification Search
CPC ......... H01L 22/32; H01L 24/30; H10D 84/87; H10P 74/273; H10W 72/327; H10W 72/357
See application file for complete search history.

(56) References Cited

U.S. PATENT DOCUMENTS 6,437,455 B2 * 8/2002 Mori ...................... H10B 10/12
                                                            257/E27.099
7,851,864 B2    12/2010 Chung
            (Continued)

FOREIGN PATENT DOCUMENTS

CN        1805139 A      7/2006
CN      101268541 A      9/2008
            (Continued)

OTHER PUBLICATIONS

JP office action in application No. 2023-534064, mailed on Aug. 13, 2024.

(Continued)

*Primary Examiner* — Eugene Lee
(74) *Attorney, Agent, or Firm* — Syncoda LLC; Feng Ma

(57)          ABSTRACT

A semiconductor layout structure includes: active layers, each active layer including a first active area and a second active area arranged adjacent to the first active area, the first active area including first transistor areas spaced apart from each other, the second active area including second transistor areas spaced apart from each other; and gate layers, each gate layer being arranged above a respective active layer, and including at least one first gate structure extending along a first direction, and second gate structures spaced apart from each other in the first direction, and the at least one first gate structure and the second gate structures being arranged adjacent to each other, the at least one first gate structure corresponding to the first transistor areas, and each second gate structure corresponding to a second transistor area.

10 Claims, 4 Drawing Sheets

(56)                References Cited

U.S. PATENT DOCUMENTS

| | | | | |
|---|---|---|---|---|
| 8,816,402 | B2 * | 8/2014 | Becker | H10D 84/83 |
| | | | | 257/211 |
| 11,900,882 | B2 * | 2/2024 | Moon | H10K 59/1216 |
| 2003/0122160 | A1 | 7/2003 | Houston | |
| 2006/0118784 | A1 * | 6/2006 | Lee | G01R 31/2884 |
| | | | | 257/48 |
| 2006/0163613 | A1 * | 7/2006 | Chang | H10D 84/998 |
| | | | | 257/E27.11 |
| 2006/0246605 | A1 * | 11/2006 | Jung | H10B 10/00 |
| | | | | 257/E27.099 |
| 2008/0169466 | A1 | 7/2008 | Stine | |
| 2009/0085118 | A1 * | 4/2009 | Hong | H10D 89/10 |
| | | | | 257/E29.022 |
| 2017/0278757 | A1 * | 9/2017 | Hodel | H10D 84/038 |
| 2020/0168700 | A1 * | 5/2020 | Song | H10D 84/859 |
| 2021/0231727 | A1 * | 7/2021 | Park | G01R 31/2644 |
| 2025/0267840 | A1 * | 8/2025 | Oh | H10B 12/05 |

FOREIGN PATENT DOCUMENTS

| | | | |
|---|---|---|---|
| CN | 105428271 | A | 3/2016 |
| CN | 206040637 | U | 3/2017 |
| CN | 106560909 | A | 4/2017 |
| CN | 111223854 | A | 6/2020 |
| CN | 112687664 | A | 4/2021 |
| CN | 113657071 | A | 11/2021 |
| JP | 2006165569 | A | 6/2006 |
| TW | 202025427 | A | 7/2020 |

OTHER PUBLICATIONS

First Office Action of the Taiwanese application No. 111132983, issued on Mar. 15, 2023.

International Search Report in the international application No. PCT/CN2022/093395, mailed on Dec. 21, 2022.

* cited by examiner

SEMICONDUCTOR LAYOUT STRUCTURE AND SEMICONDUCTOR TEST STRUCTURE

CROSS-REFERENCE TO RELATED APPLICATIONS

This is a continuation application of International Patent Application No. PCT/CN2022/093395 filed on May 17, 2022, which claims priority to Chinese Patent Application No. 202210382204.0 filed on Apr. 12, 2022. The disclosures of these applications are hereby incorporated by reference in their entirety.

BACKGROUND

In a semiconductor manufacturing process, in order to effectively monitor the problems in the semiconductor manufacturing process and the performance of the manufactured transistor to facilitate adjustment and optimization of the manufacturing process, an electrical test structure is generally manufactured in a semiconductor structure. After the semiconductor structure is manufactured, an electrical test is performed on the electrical test structure in the semiconductor structure, so that the reliability of the semiconductor manufacturing process and the stability of the transistor in the semiconductor structure are evaluated through the resistance or compatibility of the electrical test structure.

However, at present, there is a problem that the parasitic leakage of the transistor is relatively large after the semiconductor test structure is manufactured.

SUMMARY

The embodiments of the disclosure relate to the field of semiconductors, in particular to a semiconductor layout structure and a semiconductor test structure.

An embodiment of the disclosure provides a semiconductor layout structure, which includes: a plurality of active layers, in which each of the plurality of active layers includes a first active area and a second active area arranged adjacent to the first active area, the first active area includes a plurality of first transistor areas spaced apart from each other, the second active area includes a plurality of second transistor areas spaced apart from each other, and the plurality of active layers corresponding to the plurality of first transistor areas adjacent to each other are separated from each other; and a plurality of gate layers, in which each of the plurality of gate layers is arranged above a respective one of the plurality of active layers, and includes at least one first gate structure extending along a first direction, and a plurality of second gate structures spaced apart from each other in the first direction, and in which the at least one first gate structure and the plurality of second gate structures are arranged adjacent to each other, the at least one first gate structure corresponds to the plurality of first transistor areas, and each of the plurality of second gate structures corresponds to a respective one of the plurality of second transistor areas.

According to some embodiments of the disclosure, the other aspect of the embodiments of the disclosure further provides a semiconductor test structure, which includes: a plurality of first active areas, and a plurality of second active areas arranged adjacent to the plurality of first active areas, in which each of the plurality of first active areas is provided with a plurality of first transistors spaced apart from each other, each of the plurality of second active area is provided with a plurality of second transistors spaced apart from each other, and the plurality of first active areas corresponding to the plurality of first transistors adjacent to each other are separated from each other; and a first gate structure and a plurality of second gate structures, in which the first gate structure extends along a first direction, the plurality of second gate structures are spaced apart from each other in the first direction, the first gate structure and the plurality of second gate structures are arranged adjacent to each other, the first gate structure corresponds to the plurality of first transistors, and each of the plurality of second gate structures corresponds to a respective one of the plurality of second transistors.

BRIEF DESCRIPTION OF THE DRAWINGS

One or more embodiments are exemplarily explained through the figures in accompanying drawings corresponding thereto, these exemplary explanations do not constitute a limitation to the embodiments. Unless otherwise specifically declared, the figures in the accompanying drawings do not constitute a limitation of proportion. To describe the technical solutions in embodiments of the disclosure or in the related art more clearly, the accompanying drawings required for describing the embodiments are briefly introduced below. Apparently, the accompanying drawings in the following description show merely some embodiments of the disclosure, and persons of ordinary skill in the art can still derive other drawings from these accompanying drawings without creative efforts.

DETAILED DESCRIPTION

It can be known from the background that in the current semiconductor test structure, there is a problem that the parasitic leakage of the transistor is relatively large.

Figure 1:
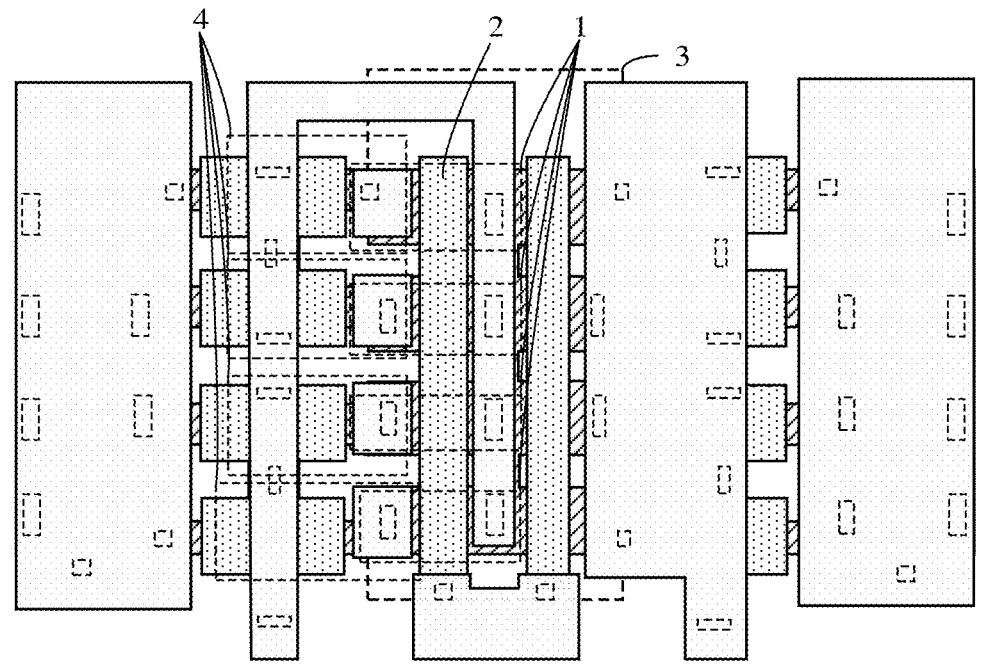
FIG. 1 is a schematic diagram of a semiconductor layout structure according to an embodiment of the disclosure.
Figure 2:
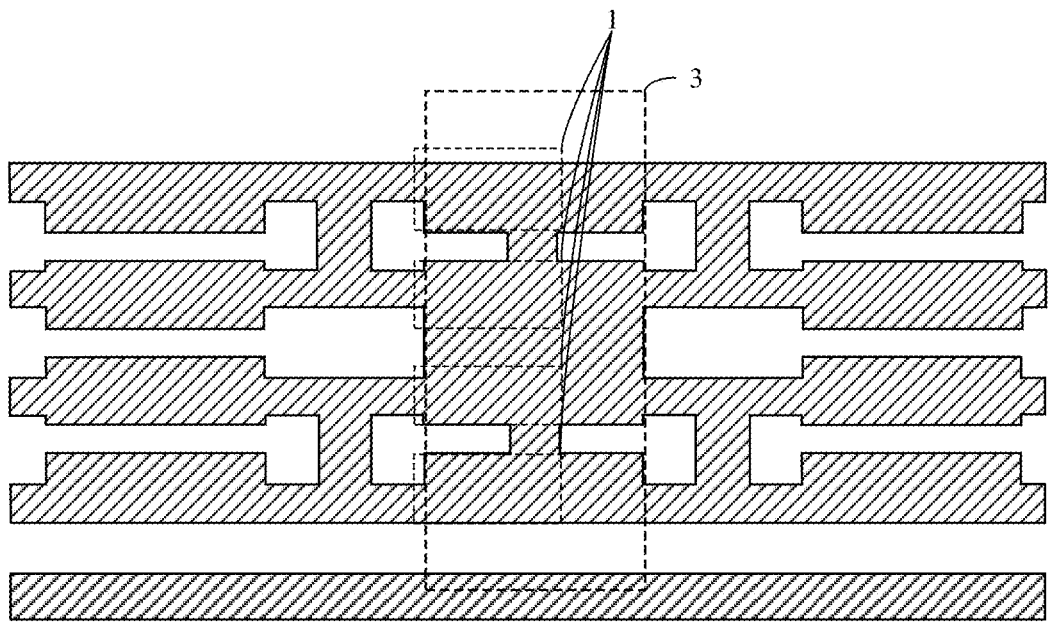
FIG. 2 is a schematic diagram of an active layer in a semiconductor layout structure according to an embodiment of the disclosure.

FIG. 1 is a schematic diagram of a semiconductor layout structure. FIG. 2 is a schematic diagram of an active layer in a semiconductor layout structure. With reference to FIG. 1 and FIG. 2, it is found through analysis that one of the reasons why the parasitic leakage of the transistor in the semiconductor test structure manufactured by using the current semiconductor layout structure is relatively large is that the semiconductor test structure is used for testing the electrical properties of the first transistors and the second transistors. In the current semiconductor layout structure, a gate layer corresponding to a plurality of first transistor areas 1 is a continuous first gate structure 2, and the active areas 3 corresponding to the adjacent first transistor areas 1 are connected to each other. That is to say, after the semiconductor test structure is manufactured, the plurality of first transistors share the same gate structure, and the active areas corresponding to the sources or the drains of the plurality of first transistors are connected to each other. In addition, the metal layers arranged above the first transistor areas 1 are connected to the metal layers arranged above the second transistor areas 4. Therefore, when one of the first transistors is tested, the coupling effect will be generated on the adjacent devices, so that the gate voltages of the adjacent devices are increased, thereby increasing the leakage current.

The embodiments of the disclosure provide a semiconductor layout structure and a semiconductor test structure. In the semiconductor layout structure, the first active areas corresponding to the adjacent first transistor areas are configured to be separated from each other. In this way, after the semiconductor test structure is manufactured on the basis of the semiconductor layout structure, when one of the first transistors is tested, the coupling effect will not be generated on the adjacent first transistors through the active areas, thereby preventing a leakage phenomenon from occurring through the active areas.

Hereinafter, the respective embodiments of the disclosure will be described in detail with reference to the accompanying drawings. However, those of ordinary skilled in the art may understand that, in the respective embodiments of the disclosure, numerous technical details are set forth in order to provide a reader with a better understanding of the disclosure. However, the technical solutions claimed in the disclosure can also be implemented without these technical details and various changes and modifications based on the respective embodiments below.

Figure 3:
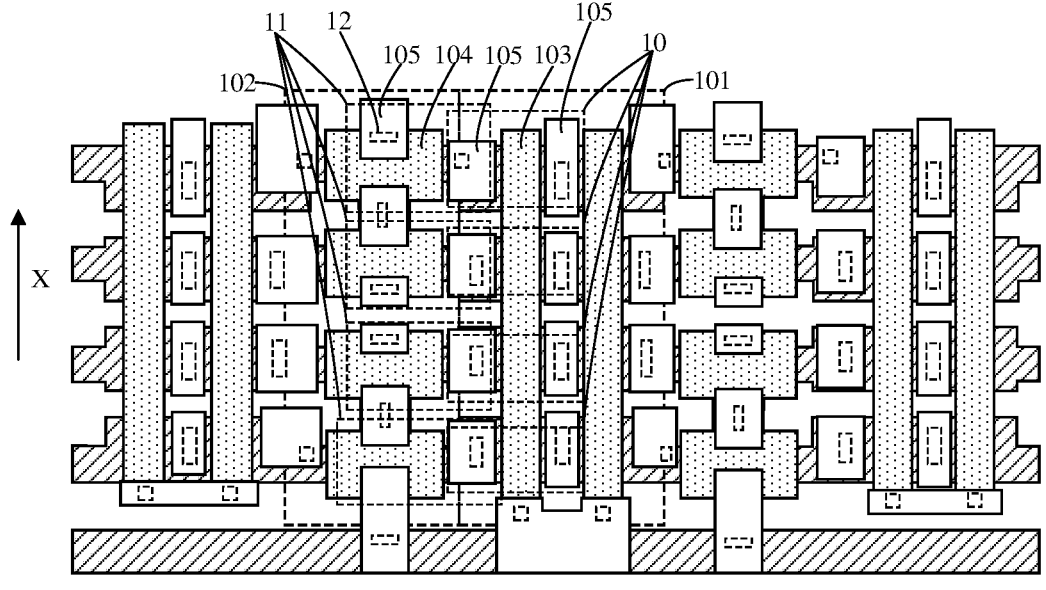
FIG. 3 is a schematic diagram of a semiconductor layout structure according to an embodiment of the disclosure.
Figure 4:
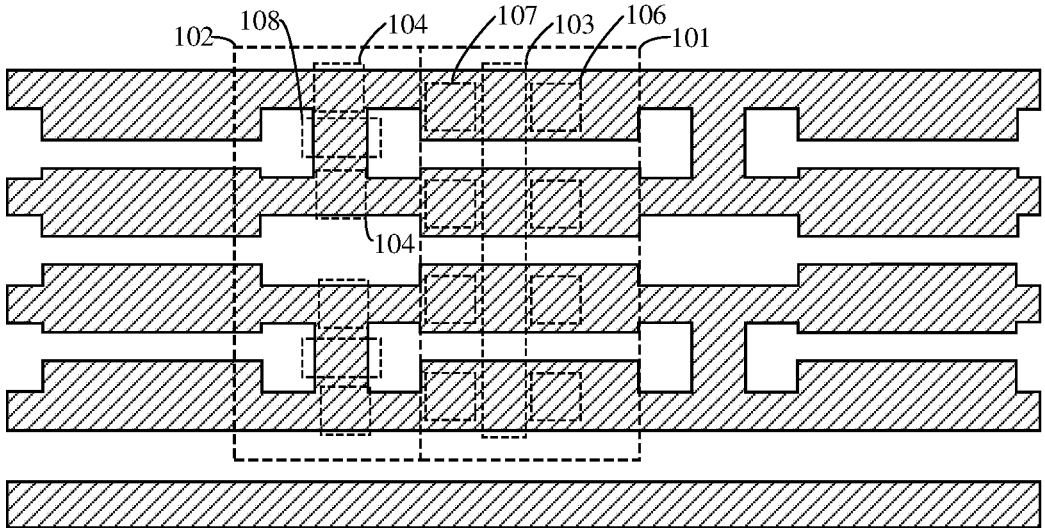
FIG. 4 is a schematic diagram of an active layer in a semiconductor layout structure according to an embodiment of the disclosure.

FIG. 3 is a schematic diagram of a semiconductor layout structure according to an embodiment of the disclosure. FIG. 4 is a schematic diagram of an active layer in a semiconductor layout structure according to an embodiment of the disclosure.

With reference to FIG. 3 and FIG. 4, the semiconductor layout structure includes a plurality of active layers and a plurality of gate layers. Each active layer includes a first active area 101, and a second active area 102 arranged adjacent to the first active area 101. The first active area 101 includes a plurality of first transistor areas 10 spaced apart from each other, and the second active area 102 includes a plurality of second transistor areas 11 spaced apart from each other. The plurality of active layers corresponding to the first transistor areas 10 adjacent to each other are separated from each other. Each gate layer is arranged above a respective active layer. Each gate layer includes at least one first gate structure 103 extending along a first direction X, and a plurality of second gate structures 104 spaced apart from each other in the first direction X. The first gate structure 103 and the second gate structures 104 are arranged adjacent to each other, the first gate structure 103 corresponds to the plurality of first transistor areas 10, and each of the second gate structures 104 corresponds to a respective one of the second transistor areas 11.

The first active areas 101 corresponding to the adjacent first transistor areas 10 are configured to be separated from each other, so that the adjacent first transistor areas 10 do not share the same first active area 101. In this way, after the semiconductor test structure is manufactured on the basis of the semiconductor layout structure, when any one of the plurality of first transistors is tested, the coupling effect will not be generated on the adjacent first transistors through the first active areas 101, thereby improving the parasitic leakage phenomenon of the semiconductor test structure.

The first active area 101 and the second active area 102 are arranged adjacent to each other. That is, the first transistor areas 10 and the second transistor areas 11 are arranged adjacent to each other, and the first transistor areas 10 and the second transistor areas 11 are two adjacent columns of transistor areas. One column of the first transistor areas 10 corresponds to the same first gate structure 103, and each second transistor area 11 in one column of second transistor areas 11 corresponds to a respective one of the second gate structures 104. It should be noted that, in the embodiments of the disclosure, the first active area 101 corresponding to one column of first transistors and the second active area 102 corresponding to one column of second transistors adjacent to the first transistors are taken as an example. In fact, a substrate further includes a plurality of first active areas 101 and a plurality of second active areas 102.

In some embodiments, a distance between the first active areas 101 corresponding to the adjacent first transistor areas 10 can be set by designing an appropriate distance range. On the one hand, it is beneficial to enlarge the process window for manufacturing the first active areas 101 separated from each other, so as to reduce the difficulty of the manufacturing process. On the other hand, the distance between the first active areas 101 corresponding to the adjacent first transistor areas 10 is not too large, so as to leave a larger space for forming the first active areas 101, so that the dimension of the active area corresponding to the first transistor areas 10 is not too small, which allows the first transistors to have a better performance after the semiconductor test structure is manufactured on the basis of the semiconductor layout structure.

In some embodiments, the layout structure further includes a plurality of metal layers 105. Each metal layer 105 corresponds to a respective one of the first transistor areas 10 or a respective one of the second transistor areas 11. The metal layer 105 arranged above the first transistor area 10 is separated from the metal layer 105 arranged above the second transistor area 11. On the one hand, the metal layers 105 can provide the external electrical signals for the first transistor areas 10 and the second transistor areas 11, and on the other hand, the metal layers are configured to lead out the electrical signals from the first transistor areas 10 and the second transistor areas 11 to perform the electrical test. The metal layers 105 arranged above the first transistor areas 10 are configured to be separated from the metal layers 105 arranged above the second transistor areas 11. In this way, after the semiconductor test structure is manufactured on the basis of the semiconductor layout structure, each metal layer 105 electrically connected to a respective first transistor is separated from each metal layer 105 corresponding to a respective second transistor. Therefore, when any one of the first transistor and the second transistor is tested, the coupling effect will not be generated on the other one of the first transistor and second transistor that is not tested through the metal layers 105. That is, the electrical tests on the first transistors and the second transistors do not affect each other, thereby improving the parasitic leakage phenomenon of the semiconductor test structure. Specifically, in some embodiments, a metal contact layer 12 is further provided between each metal layer and a respective first transistor area 10 and between each metal layer and a respective second transistor area 11. The metal contact layer 12 corresponds to a metal contact structure. The metal contact structure is configured to electrically connect the metal layer with the respective first transistor area 10 or the respective second transistor area 11.

With reference to FIG. 4, in some embodiments, each first transistor area 10 includes a first doped area 106 and a second doped area 107. The first doped area 106 is arranged on a side of each first transistor area 10 away from the second transistor areas 11, and is configured as one of a source area and a drain area of each first transistor area 10. The second doped area 107 is arranged between a respective first transistor area 10 and a respective second transistor area 11, and is configured as the other one of the source area and the drain area of each first transistor area 10. In some embodiments, the first doped area 106 may be the source area of the first transistor area 10. The second doped area 107 may be the drain area of the first transistor area 10, and the second doped area 107 may further be configured as the drain area of the second transistor area 11. That is to say, the respective first transistor area 10 and the respective second transistor area 11 share one second doped area 107 as the drain area. In this way, the semiconductor test structure formed on the basis of the semiconductor layout structure has a relatively small dimension. In some embodiments, the metal layer 105 arranged above the first transistor area 10 may be specifically arranged above the first doped area 106 and the second doped area 107 respectively. Therefore, in some embodiments, when the first doped area 106 is configured as the source area of the first transistor area 10, and the second doped area 107 is configured as the drain area of the first transistor area, after the semiconductor test structure is formed, the first doped area 106 is electrically connected to the metal layer 105. Thus, on the one hand, the metal layers 105 may lead out the electrical signals from the first transistors, and on the other hand, the external electrical signals may be supplied to the sources of the first transistors through the metal layers 105, so that the second transistors may normally operate. Each metal layer 105 electrically connected to each second doped area 107 may be electrically connected to a respective sub word line, so that the respective sub word line is driven by the first transistor and the second transistor.

In some embodiments, each metal layer 105 corresponding to the first doped area 106 is separated from each metal layer 105 corresponding to the second doped area 107, and the metal layers 105 corresponding to the adjacent first doped areas 106 are separated from each other. In this way, the external electrical signals supplied by the metal layers 105 to the first doped areas 106 will not interfere with the second doped areas 107. Moreover, the metal layers 105 corresponding to the adjacent first doped areas 106 are separated from each other, so that when the first transistor corresponding to one first transistor area 10 in one column of first transistor areas 10 is tested, a problem that electrons moving in the metal layer 105 above the first transistor to be tested are transported to the metal layer 105 above a first transistor adjacent to the first transistor to be tested will not occur, so that the coupling effect can be prevented from being generated on the adjacent first transistors, thereby further improving the parasitic leakage of the semiconductor test structure.

Figure 5:
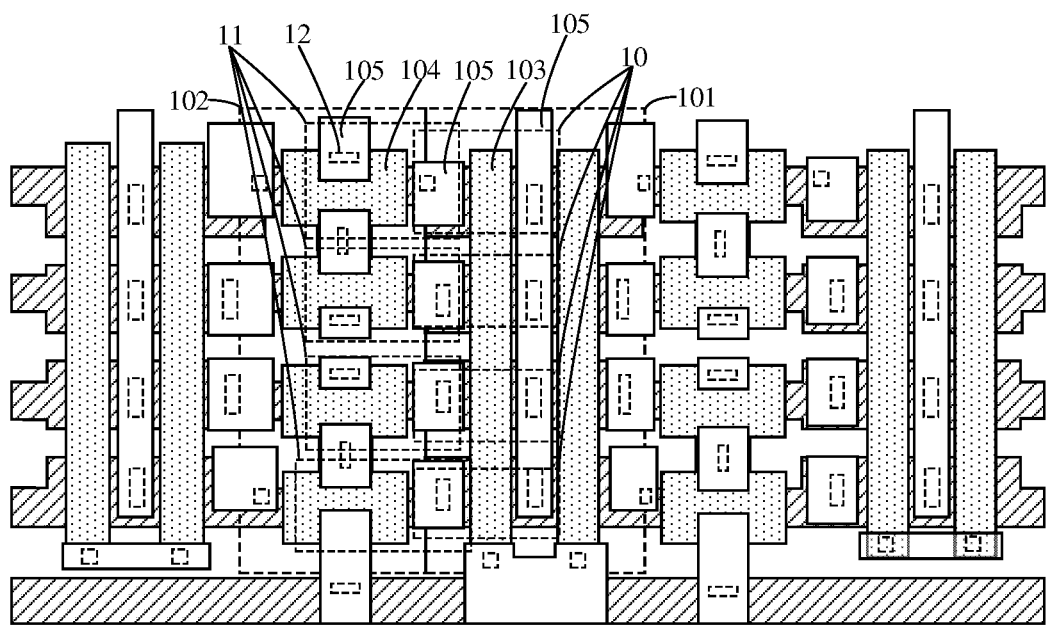
FIG. 5 is a schematic diagram of another semiconductor layout structure according to an embodiment of the disclosure.

FIG. 5 is a schematic diagram of another semiconductor layout structure according to an embodiment of the disclosure. With reference to FIG. 5, in other embodiments, the metal layers corresponding to two adjacent first doped areas may not be separated from each other.

In some embodiments, the metal layer 105 corresponding to the second transistor area 11 is arranged above the second gate structure 104. In this way, after the semiconductor test structure is manufactured on the basis of the semiconductor layout structure, each metal layer 105 is electrically connected to the respective second gate structure. Thus, on the one hand, the driving signals can be transmitted to the second gate structures 104 through the metal layers 105, so as to drive the second transistors. On the other hand, the electrical property of the second transistors can be tested through the metal layers 105. In addition, the metal layers 105 arranged above the second gate structures 104 are separated from the metal layers 105 arranged above the first transistors, so that when the second transistors corresponding to the second transistor areas 11 are tested, the coupling effect will not be generated on the first transistors corresponding to the first transistor areas 10 through the metal layers 105. Specifically, since the metal layers 105 are electrically connected to the second gate structures 104, when the second transistors are turned on, the electrons moving in the metal layers 105 electrically connected to the second gate structures 104 are not transported to the metal layers 105 electrically connected to the first transistors, so that the coupling effect between the first transistors and the second transistors can be improved.

In some embodiments, the metal layers 105 arranged above the adjacent second gate structures 104 are separated from each other. That is to say, after the semiconductor test structure is manufactured on the basis of the semiconductor layout structure, the metal layers 105 corresponding to the adjacent second gate structures 104 are not connected to each other, so that when any one of the second transistors in one column of second transistors is tested, the coupling effect will not be generated on the adjacent second transistors through the metal layers 105, for example, the gate voltages of the second gate structures 104 in the adjacent second transistors will not be increased, thereby improving the parasitic leakage phenomenon of the semiconductor test structure.

In some embodiments, as shown in FIG. 4, each second transistor area 11 further includes a third doped area 108. The third doped area 108 is arranged between two adjacent second gate structures 104, and is configured as one of a source area and a drain area of each second transistor area 11, and the second doped area 107 is configured as the other one of the source area and the drain area of each second transistor area 11. The metal layer 105 corresponding to the second transistor area 11 is further arranged above the third doped area 108. Each metal layer 105 corresponding to a respective second gate structure 104 is separated from each metal layer 105 corresponding to the third doped area 108. In some embodiments, when the second doped area 107 is configured as the drain area of the second transistor area 11, the third doped area 108 may be configured as the source area of the second transistor area. In some embodiments, the third doped area 108 may be further configured as a common source area between the second transistor areas 11 corresponding to two adjacent second gate structures 104. That is, a smaller number of third doped areas 108 are provided to form a larger number of second transistor areas 11, so that the dimension of the semiconductor layout structure becomes smaller, and the dimension of the manufactured semiconductor test structure becomes smaller. It can be understood that, in other embodiments, the second doped area 107 can also be configured as the source area of the second transistor area 11, and the third doped area 108 can be configured as the drain area of the second transistor area 11.

In the semiconductor test structure manufactured on the basis of the semiconductor layout structure, the third doped area 108 is configured as a common source of two adjacent second transistors. When the electrical test is performed on one of the two adjacent second transistors, this second transistor is turned on by the second gate structure 104 of this second transistor on the basis of the driving signals transmitted through the metal layer 105. Since each metal layers 105 corresponding to a respective second gate structure 104 is separated from each metal layer 105 corresponding to a respective third doped area 108, the electrons and minority carriers moving in the second gate structures 104 are not transmitted to the third doped areas 108 through the metal layers 105. Thus, the coupling effect will not be generated on another second transistor sharing the third doped area 108, so that the parasitic leakage of the semiconductor test structure is improved.

Figure 6:
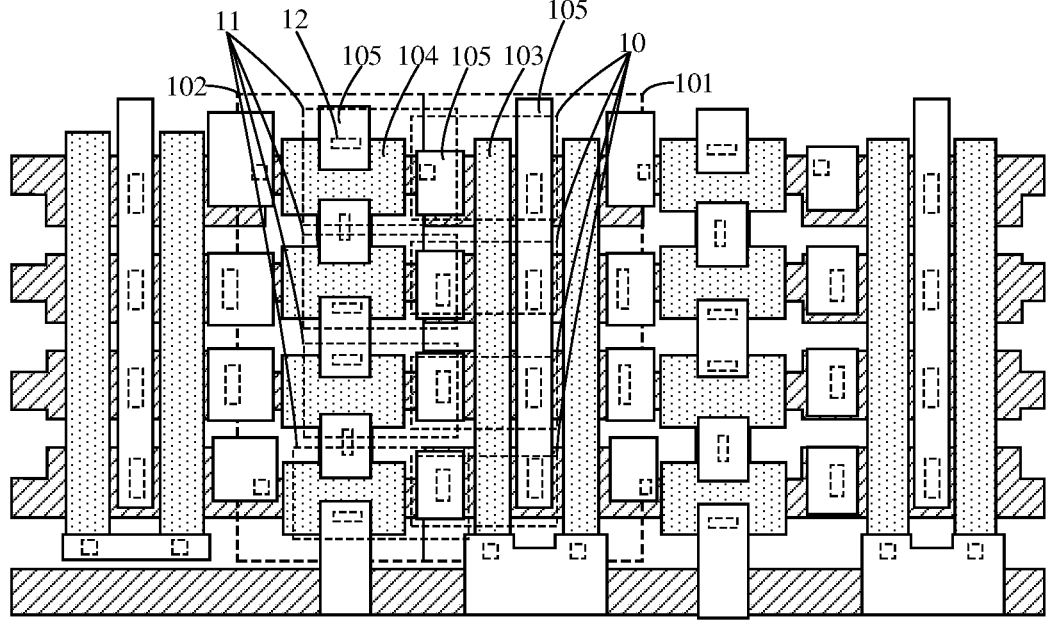
FIG. 6 is a schematic diagram of yet another semiconductor layout structure according to an embodiment of the disclosure.

FIG. 6 is a schematic diagram of yet another semiconductor layout structure according to an embodiment of the disclosure. With reference to FIG. 6 and FIG. 4, in some embodiments, the second gate structures 104 of two second transistor areas 102 that do not share the same third doped area 108 are arranged opposite to each other, and the metal layers 105 corresponding to the two second gate structures 104 arranged opposite to each other are connected to each other. In this way, it is beneficial to reduce the process difficulty of actually manufacturing the metal layers 105 for the following reason. As the dimension of the semiconductor device becomes smaller and smaller, the dimension of the semiconductor layout structure also becomes smaller and smaller. Therefore, in two adjacent second transistors that do not share the same third doped area 108, the distance between the second gate structures 104 arranged opposite to each other is relatively small. The metal layers 105 corresponding to two adjacent second gate structures 104 are configured to be connected to each other, so that the process window for manufacturing the metal layers 105 can be enlarged, which is beneficial to improve the production efficiency.

In the semiconductor layout structure provided by the above embodiments, the first active areas 101 corresponding to the adjacent first transistor areas 10 are configured to be separated from each other, that is, two adjacent first transistor areas 10 do not share the same first active area 101. In this way, in the manufactured semiconductor test structure, two adjacent first transistors do not share the same first active area 101. That is, when the electrical test is performed on one of the first transistors, the electrons moving in the first active area 101 corresponding to this first transistor will not be moved to the first active area 101 corresponding to the adjacent first transistor. That is, the coupling effect will not be generated on the adjacent first transistors through the first active areas 101, so that the parasitic leakage phenomenon of the semiconductor test structure is improved.

Another embodiment of the disclosure provides a semiconductor test structure. The semiconductor test structure can be manufactured by the semiconductor layout structure provided by the above disclosed embodiments. The semiconductor test structure provided by another embodiment of the disclosure will be described below in detail.

The semiconductor test structure includes: a plurality of first active areas, and a plurality of second active areas arranged adjacent to the plurality of first active areas, in which each of the plurality of first active areas is provided with a plurality of first transistors spaced apart from each other, each of the plurality of second active areas is provided with a plurality of second transistors spaced apart from each other, and the plurality of first active areas corresponding to the adjacent first transistors of the plurality of first transistors are separated from each other; and a first gate structure and a plurality of second gate structures, in which the first gate structure extends along a first direction, the plurality of second gate structures are spaced apart from each other in the first direction, the first gate structure and the plurality of second gate structures are arranged adjacent to each other, the first gate structure corresponds to the plurality of first transistors, and each of the plurality of second gate structures corresponds to a respective one of the plurality of second transistors.

The first active areas between the adjacent first transistors are configured to be separated from each other. In this way, even if the first transistors share the same gate structure, since the first active areas between the adjacent first transistors are not connected to each other, when one of the first transistors is tested, the coupling effect will not be generated on the adjacent first transistors through the first active areas, so that the parasitic leakage phenomenon of the semiconductor test structure can be improved.

Figure 7:
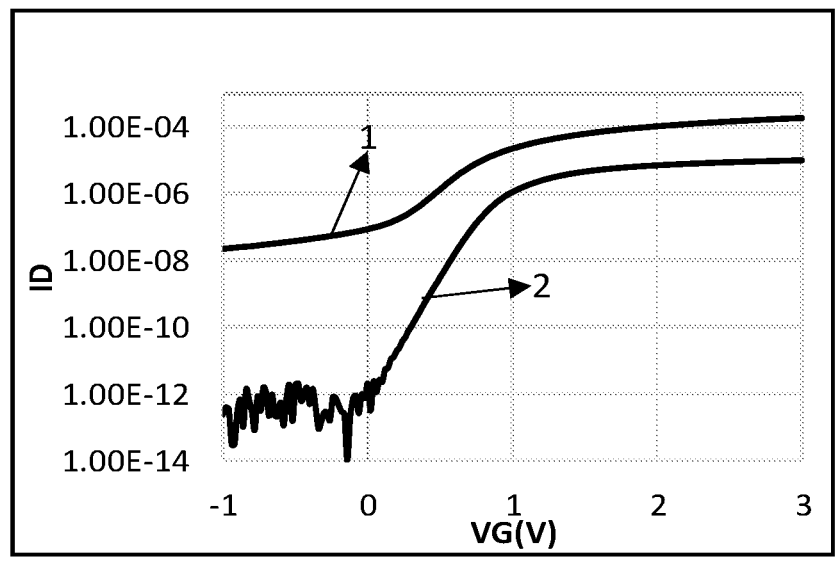
FIG. 7 is an I-V characteristic curve diagram after an electrical test is performed on a semiconductor structure.
Figure 8:
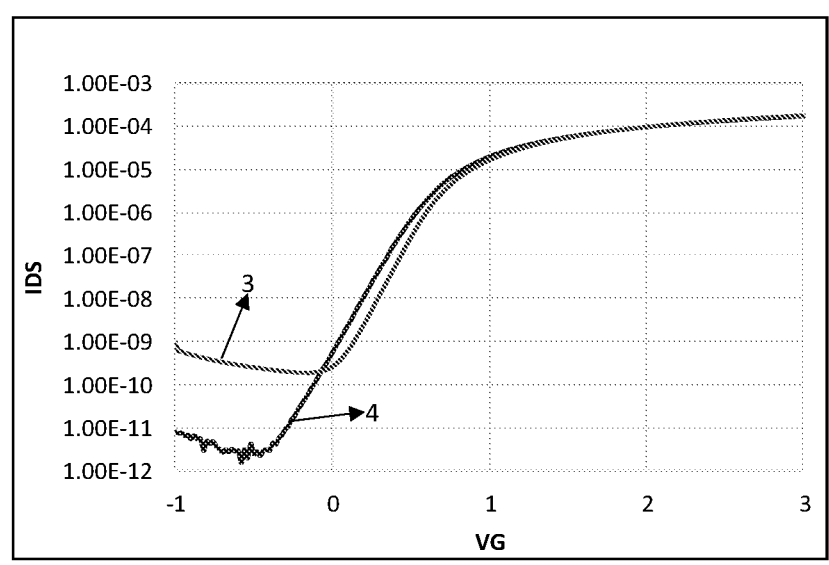
FIG. 8 is an I-V characteristic curve diagram after an electrical test is performed on a semiconductor structure according to an embodiment of the disclosure.

FIG. 7 is an I-V characteristic curve diagram of a semiconductor structure after being electrically tested. FIG. 8 is an I-V characteristic curve diagram of a semiconductor structure provided by an embodiment of the disclosure after being electrically tested. With reference to FIG. 7, the curve 1 corresponds to a semiconductor structures in which two adjacent first active areas share the same first active area. With reference to FIG. 8, the curve 3 corresponds to a semiconductor structure in which the first active areas between the adjacent first transistors are not connected to each other. It can be obtained by comparing the curve 1 with the curve 3 that, after the first active areas between the adjacent first transistors are configured to be separated from each other, the leakage current of the semiconductor structure is greatly reduced.

In some embodiments, the substrate is a semiconductor substrate, which, for example, may be a silicon substrate. In other embodiments, the material of the semiconductor substrate may also be germanium, silicon germanium, silicon carbide, and the like.

The first active areas and the second active areas are arranged in the substrate. In some embodiments, the first active areas and the second active areas are obtained by doping the substrate. Specifically, the first active areas and the second active areas can be doped with P-type semiconductor ions or N-type semiconductor ions. The P-type ions can be any one of boron ions, gallium ions, or indium ions. The N-type ions can be any one of phosphorus ions, arsenic ions, or antimony ions. It should be noted that, in the embodiments of the disclosure, a first active area corresponding to one column of first transistors and a second active area corresponding to one column of second transistors adjacent to the first transistors are taken as an example. In fact, the substrate further includes a plurality of first active areas and a plurality of second active areas.

In some embodiments, each first transistor and each second transistor can be configured as a sub word-line driver (SWD), for providing a word line voltage as a high voltage, so as to drive the sub word line. In this way, the delay of the word line voltage can be improved. The first transistor and the second transistor can be configured to pre-charge a word line in response to the driving signals. Specifically, each of the first transistor and the second transistor has a source to which the driving voltage is supplied, and a drain connected to the sub word line, and is turned on or turned off in response to the driving signals, so as to drive the sub word line.

The first active areas between the first transistors are separated from each other. That is to say, each first transistor corresponds to a respective one of the first active areas, and the first gate structure extends across the first active areas of the plurality of first transistors and is configured to form the gate structure of the plurality of first transistors. That is, the plurality of first transistors share one first gate structure. The second gate structures and the first gate structure are arranged adjacent to each other, and each second gate structure is configured as the gate structure of a respective one of the second transistors.

The distance between the first active areas corresponding to the adjacent first transistors is controlled to be within an appropriate range. When one of the first transistors is tested, the coupling effect will not generated between the active area corresponding to this first transistor and the first active area corresponding to the adjacent first transistor, so that the problem that the gate voltages of the adjacent first transistors are relatively high due to the coupling effect can be prevented, thereby improving the parasitic leakage phenomenon. In addition, within this range, the distance between the first active areas corresponding to the two adjacent first transistors is not too small, so that the difficulty of the manufacturing process can be reduced, and the process window for manufacturing the first active areas separated from each other can be enlarged. On the other hand, within this range, the distance between the first active areas corresponding to the two adjacent first transistors is not too large, leaving a larger space for forming the first active areas, so that the dimension of the first active area corresponding to the first transistor is not too small, thereby allowing the first transistors to have a better performance.

In some embodiments, the semiconductor test structure further includes a plurality of metal layers. Each metal layer is electrically connected to a respective one of the first transistors or a respective one of the second transistors. Each metal layer electrically connected to the respective one of the first transistors is separated from each metal layer electrically connected to the respective one of the second transistors. The metal layers are configured to lead out the electrical signals from the first transistors and the second transistors for testing. In some embodiments, each metal layer can be electrically connected to a respective first transistor or a respective second transistor through a respective electrical contact structure. Specifically, the metal layers lead out the electrical signals from the first transistors and the second transistors to perform the electrical test, such as the resistance test, so as to determine whether an internal short circuit or an open circuit defect occurs in the semiconductor test structure. The metal layers electrically connected to the first transistors are configured to be separated from the metal layers electrically connected to the second transistors. In this way, when the first transistor or the second transistor is tested, it can prevent the coupling effect from being generated between the first transistor and the second transistor that are adjacent to each other due to the electrical connection between the two metal layers respectively electrically connected to the first transistor and the second transistor, thereby improving the parasitic leakage phenomena of each of the first transistor and the second transistor.

With reference to FIG. 7 and FIG. 8, the curve 2 corresponds to the semiconductor structure in which each metal layer electrically connected to a respective first transistor is connected to each metal layer electrically connected to a respective second transistor. With reference to FIG. 8, the curve 4 corresponds to the semiconductor structure in which each metal layer electrically connected to a respective first transistor is separated from each metal layer electrically connected to a respective second transistor. It can be found by comparing the curve 2 with the curve 4 that each metal layer corresponding to the respective first transistor is configured to be separated from each metal layer corresponding to the respective second transistor, so that after the semiconductor structure is tested, the leakage current in the semiconductor structure is greatly reduced.

In some embodiments, a material of the metal layer can be any one of Cu, Al, or W.

In some embodiments, the first transistor includes a first doped area and a second doped area. The first doped area is arranged on a side of the first transistor away from the second transistor, and is configured as one of a source and a drain of the first transistor. The second doped area is arranged between a respective first transistor and a respective second transistor, and is configured as the other one of the source and the drain of the first transistor. Each metal layer corresponding to a respective first transistor is electrically connected to the first doped area or the second doped area.

In some embodiments, the first doped area and the second doped area are arranged in the first active area. In some embodiments, an ion doping type of the first doped area is the same as an ion doping type of the second doped area, and the ion doping type of the first doped area is opposite to the ion doping type of the substrate. In this way, the first doped area and the second doped area can respectively form a PN junction with the substrate. Specifically, in some embodiments, the first doped area and the second doped area can be doped with the N-type ions, and the substrate can be doped with the P-type ions. In other embodiments, the first doped area and the second doped area can also be doped with the P-type ions, and the substrate can be doped with the N-type ions. In some embodiments, the N-type ions can be at least one of arsenic ions, phosphorus ions, or antimony ions, and the P-type ions can be at least one of boron ions, indium ions, or gallium ions.

In some embodiments, the first doped area can be the source of the first transistor. The second doped area can be the drain of the first transistor, and the second doped area is further configured as the drain of the second transistor. That is, the first transistor and the second transistor share one drain. In this way, the dimension of the semiconductor test structure may be relatively small. The metal layer is electrically connected to a respective first doped area. In this way, when the first doped area is configured as the source of the first transistor, on the one hand, the electrical signals from the first transistors can be leaded out, and on the other hand, the external electrical signals may be supplied to the sources of the first transistors through the metal layers, so that the first transistors may normally operate. Moreover, the metal layer is further electrically connected to a respective second doped area. When the second doped area is configured as the drain of the first transistor and the second transistor, the metal layer may be further electrically connected to the respective sub word line, so that the first transistor and the second transistor drive the respective sub word line.

In some embodiments, each metal layer corresponding to a respective first doped area is separated from each metal layer corresponding to a respective second doped area, and the metal layers corresponding to the adjacent first doped areas are separated from each other. Each metal layer corresponding to the respective first doped area is separated from each metal layer corresponding to the respective second doped area, so that when the first doped area is configured as the source of the first transistor, and the second doped area is configured as the drain of the first transistor, the metal layer electrically connected to the first doped area supplies the driving voltage to the source of the first transistor, and the metal layer electrically connected to the second doped area drives the sub word line. Thus, the electrical signals from the source and the electrical signals from the drain do not interfere with each other.

In some embodiments, each first transistor corresponds to one first doped area. Therefore, the metal layers corresponding to the adjacent first doped areas are configured to be separated from each other, so that when the first transistor is tested, a problem that the coupling effect is generated on the adjacent first transistors due to the electrical connection between the metal layers corresponding to the adjacent first doped areas will not occur, so that the gate voltages of the adjacent first transistors can be prevented from increasing, thereby improving the parasitic leakage phenomenon.

It can be understood that, in other embodiments, the metal layers corresponding to the adjacent first doped areas can also be a continuous film layer structure, and the first doped areas of the plurality of first transistors share the same metal layer. In this way, when the first doped area is configured as the source of the first transistor, the driving voltage can be input through any node in the same metal layer. That is, the driving voltage can be simultaneously supplied to the first doped areas corresponding to the plurality of first transistors, so that the first transistor and the second transistor have higher working efficiency.

In some embodiments, when the second doped area is configured as the drain of the second transistor, considering that the drain of the first transistor and the second transistor is configured for electrically contacting the driven sub word line, therefore, in some embodiments, the metal layers on the second doped areas can be configured to be separated from each other, so that the first transistor and the second transistor may respectively drive a plurality of sub word lines.

In some embodiments, each metal layer corresponding to a respective second transistor is electrically connected to a respective second gate structure. On the one hand, the driving signals may be transmitted to the second gate structures through the metal layers, so as to drive the second transistors. On the other hand, the metal layers are configured to test the electrical properties of the second transistors. Moreover, the metal layers electrically connected to the second gate structures are separated from the metal layers electrically connected to the first transistors. That is to say, when the electrical property of the second transistor or the first transistor is tested, the coupling effect will not be generated through the metal layers. For example, when the electrical property of the first transistor is tested, the first transistor needs to be turned on. In this case, a channel between the first doped area and the second doped area of the first transistor is turned on. The metal layers corresponding to the second gate structures are separated from the metal layers corresponding to the first transistors. Therefore, the electrons moving in the metal layers electrically connected to the first transistors will not be transported to the metal layers electrically connected to the second transistors, so that the coupling effect will not be generated on the second transistors. That is, the gate voltages of the second gate structures in the second transistors will not be increased through the metal layers electrically connected to the first transistors, so that the parasitic leakage is reduced.

Each second gate structure is configured as the gate structure of one second transistor. When each metal layer is electrically connected to a respective second gate structure, considering that there may be the parasitic leakage between any two adjacent second transistors, in some embodiments, the metal layers corresponding to the adjacent second gate structures are separated from each other. In this way, when the electrical property of one of the second transistors is tested, i.e., when the second transistor is turned on by the second gate structure in response to the driving signals, since the metal layers corresponding to the adjacent second gate structures are separated from each other, the coupling effect will not be generated between the two adjacent second gate structures through the metal layers, thereby improving the parasitic leakage phenomenon between the two adjacent second transistors.

In some embodiments, the second transistor includes a third doped area. The third doped area is arranged between two adjacent second gate structures, and is configured as one of a source and a drain of the two adjacent second transistors, and the second doped area is configured as the other one of the source and the drain of the second transistor. Each metal layer corresponding to the respective second transistor is further electrically connected to the third doped area, and each metal layer corresponding to a respective second gate structure is separated from each metal layer corresponding to the third doped area.

In some embodiments, the third doped area is arranged in the active area, and an ion doping type of the third doped area can be the same as the ion doping types of the first doped area and the second doped area.

In some embodiments, when the second doped area is configured as the drain of the second transistor, the third doped area can be configured as the source of the second transistor. Specifically, in some embodiments, the third doped area can be configured as a common source between the second transistors corresponding to two adjacent second gate structures. That is to say, the second transistors corresponding to the second gate structures arranged on both sides of the third doped area share one source. When the plurality of second transistors are arranged at intervals in a column, and the number of the second transistors in one column of the second transistors is greater than two, the second gate structures of the two adjacent second transistors that do not share the same third doped area are arranged opposite to each other. In addition, the second doped area is configured as a common drain of the first transistor and the second transistor. In this way, it is only necessary to provide less doped areas to form more transistors, which is beneficial for saving the space, so that the semiconductor test structure has a smaller dimension. It can be understood that in other embodiments, the third doped area can also be configured as a common drain between the second transistors corresponding to two adjacent second gate structures, and the second doped area is configured as a common source of the first transistor and the second transistor.

The third doped area is configured as the common source of two adjacent second transistors. Therefore, each metal layer corresponding to a respective second gate structure is configured to be separated from the metal layer corresponding to the third doped area, so that when the electrical test is performed on one of the second transistors, the problem that the coupling effect is generated on the adjacent second transistors due to the electrical connection between the metal layer corresponding to the second gate structure and the metal layer corresponding to the third doped area can be prevented. Specifically, when one of the second transistors is tested, this second transistor is turned on by the second gate structure of this second transistor on the basis of the driving signals transmitted through the metal layer. Since each metal layer corresponding to a respective second gate structure is separated from the metal layer corresponding to the third doped area, the electrons and minority carriers moving in the second gate structures will not be transmitted to the third doped area through the metal layers, so that the coupling effect can be prevented from being generated on another second transistor that shares the same third doped area with this second transistor.

In other embodiments, two adjacent second transistors form a second transistor group. The second transistor group includes a third doped area. The third doped area is arranged between two adjacent second gate structures in the second transistor group, and is configured as a source or a drain of the two adjacent second transistors in the second transistor group. Moreover, in two adjacent second transistor groups, the metal layers corresponding to two second gate structures arranged opposite to each other are connected to each other. That is to say, two transistors in the same second transistor group share the same third doped area. In two adjacent transistor groups, the second gate structures of two adjacent second transistors that do not share the same third doped area are arranged opposite to each other, and the metal layers corresponding to the two second gate structures arranged opposite to each other are connected to each other, which is beneficial to reduce the process difficulty of actually manufacturing the metal layers for the following reason. As the dimension of the semiconductor device becomes smaller and smaller, the characteristic dimension of the semiconductor test structure also becomes smaller and smaller. Therefore, in two adjacent second transistors that do not share the same third doped area, the distance between two second gate structures arranged opposite to each other is relatively small. Therefore, in a process of actually manufacturing the metal layers corresponding to the second gate structures, the metal layers corresponding to two adjacent second gate structures are configured to be connected to each other, so that the process window for manufacturing the metal layers can be enlarged, which is beneficial to improve the production efficiency.

In other embodiments, when two second transistors in the second transistor group are configured to share one third doped area, in two adjacent second transistor groups, the metal layers corresponding to two second gate structures arranged opposite to each other can also be configured to be separated from each other. In this way, in the two second transistors that do not share the same third doped area, when one of the second transistors is turned on for testing, the gate voltage of the other second transistor will not be increased through the metal layer corresponding to the second gate structure, thereby reducing the parasitic leakage current.

Considering the actual manufacturing process, in some embodiments, the distance between the metal layers corresponding to two second gate structures arranged opposite to each other is not too small, so that the difficulty of the actual manufacturing process can be reduced for the following reason. Since the two second gate structures are arranged opposite to each other, and the overall dimension of the semiconductor test structure is relatively small, the actual distance between the two second gate structures is relatively small. When the metal layers corresponding to the two second gate structures arranged opposite to each other are actually manufactured, if the distance between the corresponding metal layers is too small, it may cause process damage to the second gate structures, while increasing the difficulty of the manufacturing process. Therefore, the distance between the metal layers corresponding to the opposite second gate structures is set to be relatively large, which can reduce the difficulty of the process. On the other hand, considering that the distance between the metal layers corresponding to the second gate structures needs to be close to or equal to the distance between the two second gate structures arranged opposite to each other, the distance between the metal layers corresponding to the two opposite second gate structures is not too large, so that the semiconductor test structure has a relatively small dimension.

In some embodiments, the active areas between the adjacent second transistor groups are separated from each other. In the same second transistor group, two adjacent second transistors share a third doped area. Thus, the active areas between the two second transistors that share the same third doped area need to be connected to each other. However, for two second transistors that do not share the same third doped area, two second gate structures are arranged opposite to each other. That is, no third doped area is provided between the two second gate structures. Therefore, the active areas between the two opposite second gate structures are configured to be separated from each other, so that the coupling effect will not be generated between the two second transistors that do not share the same third doped area through the active areas, thereby further improving the parasitic leakage between two adjacent second transistors.

In the semiconductor test structure provided by the above embodiments, the active areas between the adjacent first transistors are configured to be separated from each other. In this way, even if the first transistors share the same gate structure, since the first active areas between two adjacent first transistors are not connected to each other, when one of the first transistors is tested, the coupling effect will not be generated on the adjacent first transistors through the first active areas, so that the parasitic leakage phenomenon of the semiconductor test structure can be improved.

Those of ordinary skill in the art may understand that the above embodiments are specific embodiments to implement the disclosure. In practical applications, various changes may be made in forms and details without departing from the spirit and scope of the disclosure. Any persons skilled in the art may make changes and modifications without departing from the spirit and scope of the disclosure. Therefore, the protection scope of the disclosure should be subjected to the scope defined by the appended claims.

The invention claimed is:

1. A semiconductor layout structure, comprising:
an active layer, wherein the active layer comprises a first active area and a second active area arranged adjacent to the first active area, the first active area comprises a plurality of first transistor areas spaced apart from each other, the second active area comprises a plurality of second transistor areas spaced apart from each other, and portions of the active layer corresponding to the plurality of first transistor areas adjacent to each other are separated from each other;
a plurality of gate layers, wherein each of the plurality of gate layers is arranged above a respective one of the plurality of active layers, and comprises at least one first gate structure extending along a first direction, and a plurality of second gate structures spaced apart from each other in the first direction, and wherein the at least one first gate structure and the plurality of second gate structures are arranged adjacent to each other, the at least one first gate structure corresponds to the plurality of first transistor areas, and each of the plurality of second gate structures corresponds to a respective one of the plurality of second transistor areas; and a plurality of metal layers, wherein a portion of the plurality of metal layers correspond to the plurality of first transistor areas, and another portion of the plurality of metal layers correspond to the plurality of second transistor areas, and the portion of the plurality of metal layers arranged above the plurality of first transistor areas are separated from the another portion of the plurality of metal layers arranged above the plurality of second transistor areas;

wherein two adjacent second transistor areas of the plurality of second transistor areas form a second transistor area group, the second transistor area group comprises a doped area shared by the two adjacent second transistor areas in the second transistor area group, and the shared doped area is arranged between two adjacent second gate structures in the second transistor area group, and is configured as a source area or a drain area of the two adjacent second transistor areas in the second transistor area group, metal layers electrically connected to the shared doped area and the two adjacent second gate structures in the second transistor area group are separated from each other, and metal layers corresponding to two second gate structures arranged opposite to each other in two adjacent second transistor groups are connected to each other.

2. The semiconductor layout structure of claim 1, wherein each of the plurality of first transistor areas comprises a first doped area and a second doped area, and wherein the first doped area is arranged on a side of each of the plurality of first transistor areas away from the plurality of second transistor areas, and is configured as one of a source area and a drain area of each of the plurality of first transistor areas, and the second doped area is arranged between a respective one of the plurality of first transistor areas and a respective one of the plurality of second transistor areas, and is configured as the other one of the source area and the drain area of each of the plurality of first transistor areas.

3. The semiconductor layout structure of claim 2, wherein one metal layer, corresponding to the first doped area, of the plurality of metal layers, is separated from one metal layer, corresponding to the second doped area, of the plurality of metal layers, and two metal layers, corresponding to any two adjacent first doped areas, of the plurality of metal layers, are separated from each other.

4. The semiconductor layout structure of claim 2, wherein the another portion of the plurality of metal layers corresponding to the plurality of second transistor areas are arranged above the plurality of second gate structures.

5. The semiconductor layout structure of claim 4, wherein the another portion of the plurality of metal layers arranged above the plurality of second gate structures are adjacent to each other are separated from each other.

6. A semiconductor test structure, comprising:

a first active area, and a second active area arranged adjacent to the first active area, wherein the first active area is provided with a plurality of first transistors spaced apart from each other, the second active area is provided with a plurality of second transistors spaced apart from each other, and portions of the first active area corresponding to the plurality of first transistors adjacent to each other are separated from each other;

a first gate structure and a plurality of second gate structures, wherein the first gate structure extends along a first direction, the plurality of second gate structures are spaced apart from each other in the first direction, the first gate structure and the plurality of second gate structures are arranged adjacent to each other, the first gate structure corresponds to the plurality of first transistors, and each of the plurality of second gate structures corresponds to a respective one of the plurality of second transistors; and a plurality of metal layers, wherein a portion of the plurality of metal layers are electrically connected to the plurality of first transistors and another portion of the plurality of metal layers are electrically connected to the plurality of second transistors, and the portion of the plurality of metal layers electrically connected to the plurality of first transistors are separated from the another portion of the plurality of metal layers electrically connected to the plurality of second transistors;

wherein two adjacent second transistors of the plurality of second transistors form a second transistor group, the second transistor group comprises a doped area shared by the two adjacent second transistors in the second transistor group, and the shared doped area is arranged between two adjacent second gate structures in the second transistor group, and is configured as a source or a drain of the two adjacent second transistors in the second transistor group, metal layers electrically connected to the shared doped area and the two adjacent second gate structures in the second transistor area group are separated from each other, and metal layers corresponding to two second gate structures arranged opposite to each other in two adjacent second transistor groups are connected to each other.

7. The semiconductor test structure of claim 6, wherein each of the plurality of first transistors comprises a first doped area and a second doped area, and wherein the first doped area is arranged on a side of each of the plurality of first transistors away from the plurality of second transistors, and is configured as one of a source and a drain of each of the plurality of first transistors, and the second doped area is arranged between a respective one of the plurality of first transistors and a respective one of the plurality of second transistors, and is configured as the other one of the source and the drain of each of the plurality of first transistors, and wherein the portion of the plurality of metal layers corresponding to the plurality of first transistors are electrically connected to the first doped area and the second doped area respectively.

8. The semiconductor test structure of claim 7, wherein one metal layer, corresponding to the first doped area, of the plurality of metal layers is separated from one metal layer, corresponding to the second doped area, of the plurality of metal layers, and two metal layers corresponding to any two adjacent first doped areas, of the plurality of metal layers, are separated from each other.

9. The semiconductor test structure of claim 7, wherein the another portion of the plurality of metal layers corresponding to the plurality of second transistors are electrically connected to the plurality of second gate structures.

10. The semiconductor test structure of claim 9, wherein the another portion of the plurality of metal layers corresponding to the plurality of second gate structures adjacent to each other are separated from each other.

* * * * *